United States Patent [19]

Shimizu et al.

[11] Patent Number: 5,268,321
[45] Date of Patent: * Dec. 7, 1993

[54] METHOD OF MAKING DRAM CELL HAVING IMPROVED RADIATION PROTECTION

[75] Inventors: Masahiro Shimizu; Hiroki Shimano; Masahide Inuishi; Katsuhiro Tsukamoto, all of Hyogo, Japan

[73] Assignee: Mitsubishi Denki Kabushiki Kaisha, Tokyo, Japan

[*] Notice: The portion of the term of this patent subsequent to Sep. 7, 2009 has been disclaimed.

[21] Appl. No.: 295,101

[22] Filed: Jan. 9, 1989

Related U.S. Application Data

[62] Division of Ser. No. 943,052, Dec. 18, 1986, abandoned.

[30] Foreign Application Priority Data

Dec. 20, 1985 [JP] Japan ................... 60-288206

[51] Int. Cl.$^5$ .................. H01L 21/70; H01L 27/108
[52] U.S. Cl. ........................ 437/52; 437/47; 437/60; 437/228; 437/919
[58] Field of Search ................ 437/40, 41, 47, 52, 437/60, 228, 919; 357/23.5

[56] References Cited

U.S. PATENT DOCUMENTS

| | | | |
|---|---|---|---|
| 4,125,933 | 11/1978 | Baldwin et al. | 437/43 |
| 4,329,706 | 5/1982 | Crowder et al. | 357/23 |
| 4,350,536 | 9/1982 | Nakano et al. | 437/47 |
| 4,466,177 | 8/1984 | Chao | 437/60 |
| 4,516,313 | 5/1985 | Turi et al. | 357/42 |
| 4,619,038 | 10/1986 | Pintchovski | 437/200 |
| 4,621,276 | 11/1986 | Malhi | 357/42 |
| 4,622,735 | 11/1986 | Shibata | 437/200 |
| 4,660,062 | 4/1987 | Nishizawa et al. | 357/41 |

FOREIGN PATENT DOCUMENTS

| | | | |
|---|---|---|---|
| 0024905 | 3/1981 | Japan | 437/47 |
| 0049554 | 5/1981 | Japan | 437/52 |
| 57-192070 | 11/1982 | Japan . | |

OTHER PUBLICATIONS

L. J. Brillson, *Titanium-silicon and silicon dioxide reactions controlled by low temperature rapid thermal annealing*, J. Vac. Sci. Technol. A4(3), (May/Jun. 1986) pp. 993-997.

"Alpha-Particle-Induced Soft Error Rate in VLSI Circuits", George A. Sai Halasz et al, IEEE Transactions on Electron Devices, vol. Ed-29, No. 4, Apr. 1982.

Mohammadi, "Silicides for Interconnection Technology", Solid State Technology, Jan. 1981, pp. 65 to 72.

T. Yachi and S. Suyama, *Use of TiSi to form metal-oxide-silicon field effect transistors with self-aligned source/drain and gate electrode*, J. Vac. Sci. Technol. B3(4), (Jul./Aug. 1985), pp. 992-996.

Primary Examiner—Brian E. Hearn
Assistant Examiner—T. Thomas
Attorney, Agent, or Firm—Lowe, Price, LeBlanc, Becker & Shur

[57] ABSTRACT

A semiconductor memory device comprises a $p^-$-type semiconductor substrate (1), $p^+$-type regions (15, 80) formed thereon, $n^+$-type regions (6, 7) surrounded with the $p^+$-type regions (15, 80), a first gate electrode (2) formed on a charge storage region in the $n^+$-type region (6), and a second gate electrode (3) formed on the $p^+$-type region (80) and serving as a word line. The $p^+$-type regions (15, 80) prevent passage of electrons out of electron-hole pairs induced by alpha rays so as to prevent occurrence of soft errors. An oxide film (16) is formed on the side wall of the second gate electrode (3), a titanium silicide film (17) is formed on the $n^+$-type regions (6, 7) and a titanium silicide film (18) is formed on the second gate electrode (3) in a self-aligning manner. Therefore, increase of interconnection resistance of the second gate electrode (3) and diffusion resistance of the $n^+$-type regions (6, 7) is prevented. A bit line is formed on the semiconductor region and connected thereto. An inner layer insulation film is optionally connected thereto. An inner layer insulation film is optionally formed between the bit line and the refractory metal silicide film placed on the semiconductor $n^+$-type region. The interlayer insulation film preferably comprises a silicon oxide film or a phosphorus oxide film. Finally, a protective film is optionally formed on the bit line. The protective film is preferably made of a material having a low dielectric constant.

11 Claims, 2 Drawing Sheets

METHOD OF MAKING DRAM CELL HAVING IMPROVED RADIATION PROTECTION

This is a division, of application Ser. No. 06/943,052, filed Dec. 18, 1986 now abandoned.

BACKGROUND OF THE INVENTION

Field of the Invention

The present invention relates to a semiconductor memory device, and more particularly, it relates to a semiconductor memory device capable of preventing soft errors caused by radioactive rays such as alpha rays.

Description of the Prior Art

Conventionally, a dynamic RAM (Random Access Memory) which stores data depending on presence or absence of stored charges has been known as a semiconductor memory device.

FIG. 1 is a cross sectional view showing a structure of a peripheral portion of a memory cell in a 256 k dynamic RAM as an example of such a conventional semiconductor memory.

Description is now made of the structure of the peripheral portion of the memory cell shown in FIG. 1.

In FIG. 1, a p+-type region 10 for preventing inversion and parasitism is formed on a p−-type semiconductor substrate 1, and an insulator film 9 for isolating elements is formed on the p+-type region 10. In addition, an n+-type region 6 and an n+-type region 7 are formed spaced apart from each other on the p−-type semiconductor substrate 1, and a p+-type region 8 is formed on the p−-type semiconductor substrate 1 between the n+-type region 6 and the n+-type region 7. Furthermore, a first gate insulator film 4 is formed on a part of the n+-type region 6 and the insulator film 9. A first gate electrode 2 connected to a power supply (not shown) through a terminal 13 is formed on the first gate insulator film 4. Additionally, a second gate insulator film 5 is formed on the p+-type region 8, an end of the n+-type region 6, and an end of the n+-type region 7. A second gate electrode 3 connected to a word line (not shown) through a terminal 14 is formed on the second gate insulator film 5. The right portion located under the first gate insulator film 4, within the n+-type region 6 serves as a charge storage region for storing data, while the remaining left portion serves as one source/drain region of a transfer gate transistor. The charge storage region, the first gate insulator film 4 and the first gate electrode 2 constitute a memory cell. The n+-type region 7 is connected to a bit line (not shown) and serves as the other source/drain region of the transfer gate transistor. The p+-type region 8 serves to control the threshold voltage of the second gate electrode 3. Thus, the transfer gate transistor comprises the p−-type semiconductor substrate 1, the n+-type region 6, the n+-type region 7, the p+-type region 8, the second gate insulator film 5 and the second gate electrode 3. A depletion layer 11 is formed between the n+-type region 6 and the p−-type semiconductor substrate 1, and a depletion layer 12 is formed between the n+-type region 7 and the p−-type semiconductor substrate 1.

For simplicity of illustration, an interlayer insulation film formed on the exposed portion in the n+-type region 6, the second gate electrode 3 and the n+-type region 7, interconnection portions such as a bit line formed on the interlayer insulation film, and a protective layer formed on the interlayer insulation film and the interconnection portions are omitted in FIG. 1. Instead of forming the n+-type region 6 serving as an impurity diffusion region, a positive potential may be applied to the first gate electrode 2 to induce an n+-type inversion layer on a portion corresponding to the n+-type region 6 on the p−-type semiconductor substrate 1 through the first gate insulator film 4, thereby to store charges therein.

Description is now made on the operation of the peripheral portion of the memory cell shown in FIG. 1.

In the semiconductor memory device shown in FIG. 1, a state in which electrons are stored in the n+-type region 6 serving as a charge storage region in the memory cell is defined as "0" and a state in which electrons are not stored therein is defined as "1". The potential of the n+-type region 7 connected to a bit line (not shown) is held at a predetermined intermediate level by a sense amplifier (not shown).

When the potential of a word line is increased and the potential of the second gate electrode 3 in the transfer gate transistor connected to the word line exceeds the threshold voltage, a channel of an n+-type inversion layer is formed directly under the second gate electrode 3, so that the channel is rendered conductive between the n+-type region 6 and the n+-type region 7.

When storage data of the memory cell is "0", that is, when electrons are stored in the n+-type region 6, the potential of the n+-type region 7, which has been so far held at an intermediate level, is decreased by conduction between the n+-type region 6 and the n+-type region 7 connected to the bit line. On the other hand, if and when storage data of the memory cell is "1", that is, when electrons are not stored in the n+-type region 6, the potential of the n+-type region 7, which has been at an intermediate level, is increased by that conduction. Such potential change of the bit line is sensed by the sense amplifier so that the same is amplified and extracted, while the same storage data is refreshed to be rewritten in the memory cell within the same cycle.

The peripheral portion of the conventional memory cell shown in FIG. 1 is operated as described above. However, since the source/drain region and the charge storage region are formed of an n+-type region or an n+-type inversion layer, electrons out of electron-hole pairs generated upon incidence of radioactive rays such as alpha rays into a memory chip are collected in the n+-type region 6 and the n+-type region 7, so that there occurs malfunctions (referred to as soft errors hereinafter) in which original storage data are inverted.

A method for preventing soft errors induced by such alpha rays is disclosed in, for example, an article by George A. Sai-Halasz et al., entitled "Alpha-Particle-Induced Soft Error Rate in VLSI Circuits", IEEE TRANSACTIONS ON ELECTRON DEVICES, Vol. ED-29, No. 4, April, 1982, pp. 725–731.

FIG. 2 shows an example of a conventional semiconductor memory device for preventing occurrence of soft errors as described above. More specifically, in FIG. 2, a p+-type region 15 is formed around the n+-type region 6 to increase memory cell capacity, that is, critical charge capacity so that malfunctions may not be caused even if electrons generated by radioactive rays such as alpha rays are collected in the n+-type region 6, whereby occurrence of soft errors can be prevented.

However, the n+-type region 7 connected to a bit line is not protected from collection of electrons and even if a p+-type region is provided additionally around the n+-type region 7, p+-type regions are arranged opposed to each other within a narrow spacing of at most 2 to 3 μm to cause operation of a parasitic pnp transistor, so that it becomes difficult to operate the transfer gate transistor stably.

In addition, a semiconductor memory device having a fine structure shown in FIGS. 1 and 2 presents a problem of increase of interconnection resistance of a gate electrode or the like.

SUMMARY OF THE INVENTION

Briefly stated, the present invention provides a semiconductor memory device which comprises a semiconductor substrate of a first conductivity type; a semiconductor layer of the first conductivity type formed on the semiconductor substrate, which is higher in impurity concentration than the semiconductor substrate; a first semiconductor region of a second conductivity type formed on the semiconductor layer, a part of the first semiconductor region serving as one source/drain region and the other part serving as a charge storage region for storing data; a second semiconductor region of the second conductivity type formed apart from the first semiconductor region on the semiconductor layer, the second semiconductor region serving as the other source/drain region; a bit line formed on the second semiconductor region and connected to the second semiconductor region; a first gate insulator film formed on the charge storage region in the first semiconductor region; a first gate electrode formed on the first gate insulator film, the first gate electrode being connected to a power supply for supplying constant voltage; a second gate insulator film formed on the semiconductor layer at least between the first and second semiconductor regions; a second gate electrode formed on the second gate insulator film, the second gate electrode being connected to a word line; a first refractory metal silicide film formed on one source/drain region in the first semiconductor region; a second refractory metal silicide film formed on the second semiconductor region; and a third refractory metal silicide film formed on the second gate electrode.

In accordance with another aspect of the present invention, the semiconductor memory device further comprises an oxide film formed on the side wall of the second gate electrode.

In accordance with still another aspect of the present invention, the semiconductor memory device further comprises an interlayer insulation film of low dielectric constant formed between the second refractory metal silicide film and the bit line.

In accordance with a still further aspect of the present invention, the semiconductor memory device comprises a protective layer of low dielectric constant formed on the bit line.

Accordingly, a principal object of the present invention is to provide a semiconductor memory device capable of preventing soft errors caused by radioactive rays such as alpha rays while maintaining the fine structure and stable operation of a memory transistor.

A principal advantage of the present invention is that operation of a parasitic pnp transistor can be prevented from occurring by surrounding first and second semiconductor regions of the second conductivity type with a semiconductor layer of the first conductivity type having high impurity concentration, so that soft errors due to alpha rays or the like can be prevented.

Another advantage of the present invention is that even if the first and second semiconductor regions and the second gate electrode are made fine, diffusion resistance of each semiconductor region and interconnection resistance of the second gate electrode can be decreased by forming refractory silicide films of high fusing point thereon.

Still another advantage of the present invention is that interconnection resistance of the second gate electrode can be decreased by forming an oxide film on the side wall of the second gate electrode.

A further advantage of the present invention is that stray capacitance of a bit line can be reduced by forming an interlayer insulation film or a protective film for the bit line so that voltage of signals sensed by a sense amplifier can be increased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
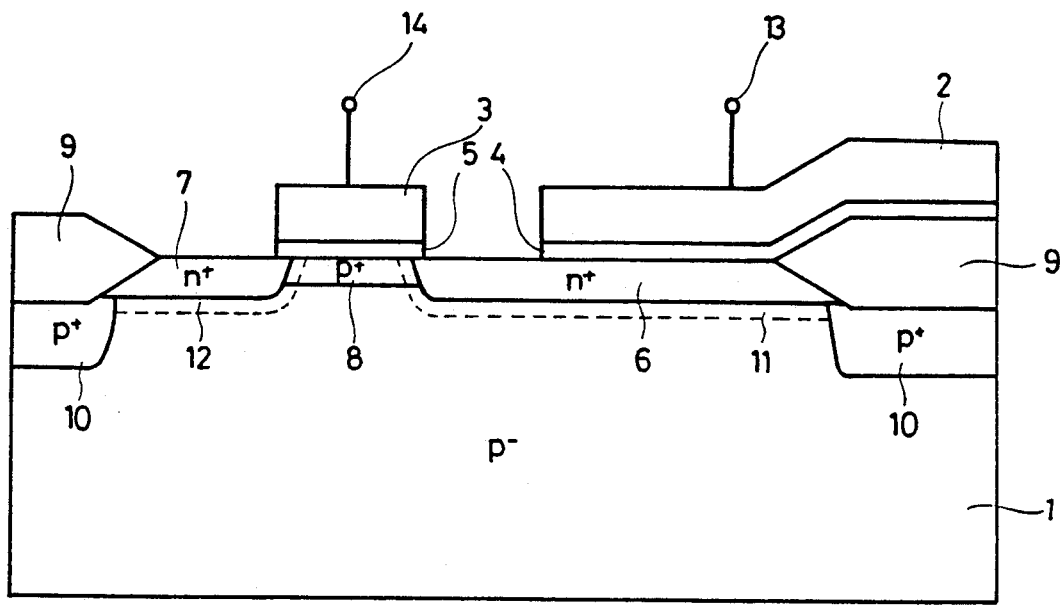
FIG. 1 is a cross sectional view showing a structure of a peripheral portion of a memory cell of a conventional dynamic RAM.
Figure 2:
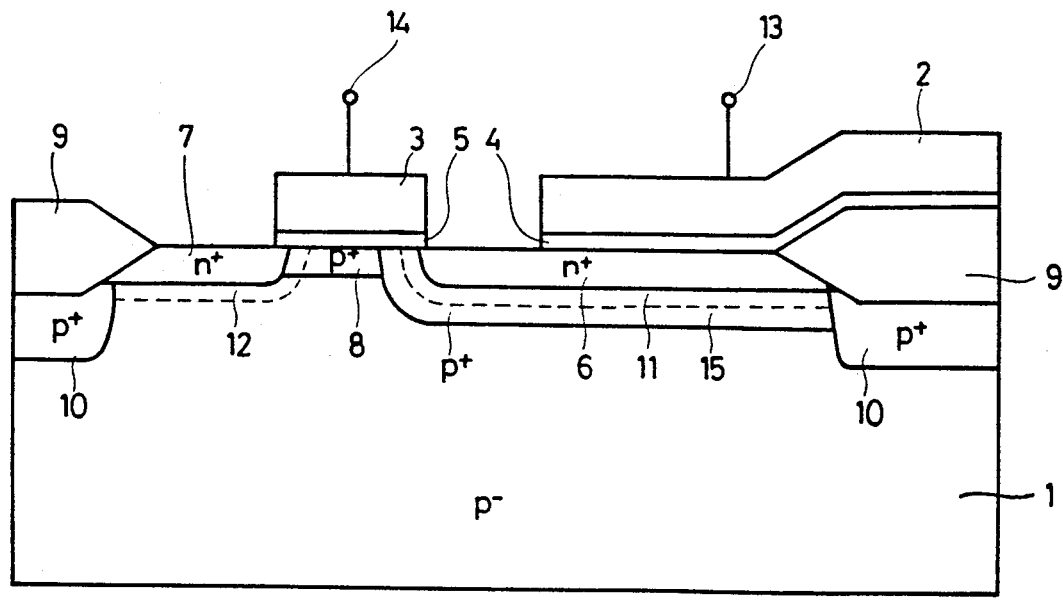
FIG. 2 is a cross sectional view showing a structure of a peripheral portion of a memory cell of a conventional dynamic RAM capable of preventing soft errors.
Figure 3:
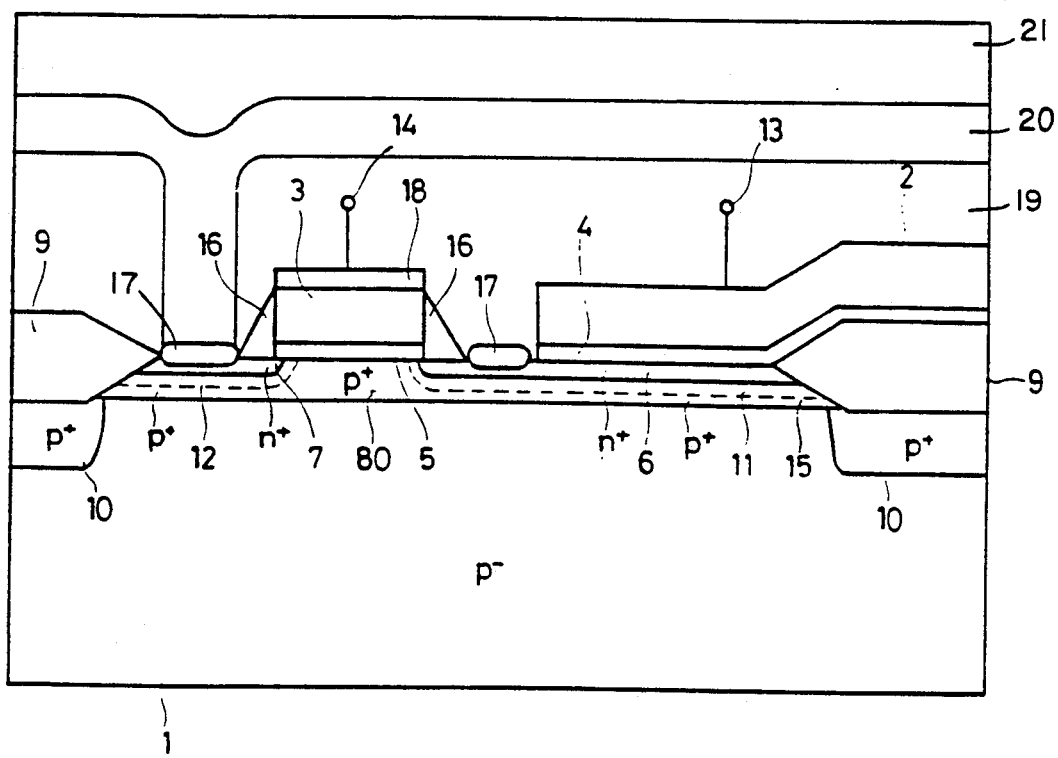
FIG. 3 is a cross sectional view showing a structure of a peripheral portion of a memory cell of a semiconductor memory device according to an embodiment of the present invention.

FIG. 3 is a cross sectional view showing a structure of a peripheral portion of a memory cell of a semiconductor memory device according to an embodiment of the present invention.

Description is now made on a manufacturing process of the peripheral portion of the memory cell shown in FIG. 3.

P-type impurities are selectively ion-implanted and diffused in a $p^-$-type semiconductor substrate 1 having impurity concentration of, for example, $1 \times 10^{14}$ to $1 \times 10^{16} cm^{-3}$, to form a $p^+$-type region 10 for preventing inversion and parasitism. Then, an insulator film 9 for isolating elements is formed on the $p^+$-type region 10.

N-type impurities are selectively ion-implanted and diffused in the $p^-$-type semiconductor substrate 1 to form a charge storage region in an $n^+$-type region 6 and then, p-type impurities are ion-implanted and diffused in the $p^-$-type semiconductor substrate 1 to form a $p^+$-type region 15 having impurity concentration of, for example, $1 \times 10^{15}$ to $1 \times 10^{17} cm^{-3}$ around the charge storage region. Then, a first gate insulator film 4 and a first gate electrode 2 are formed.

$p^-$-type impurities are ion-implanted and diffused in the region to form a transfer gate transistor in the $p^-$-type semiconductor substrate 1 so that a $p^+$-type region 80 having impurity concentration of, for example, $1 \times 10^{15}$ to $1 \times 10^{17} cm^{-3}$. Then, a second gate insulator film 5 and a second gate electrode 3 are formed. The region under the second gate insulator film 5 in the $p^+$-type region 80 is a region for controlling the threshold voltage of the second gate electrode 3.

N-type impurities are ion-implanted and diffused in the p+-type region 80 so that a region serving as one source/drain in the n+-type region 6 and an n+-type region 7 connected to a bit line and serving as the other source/drain therein are formed. The source/drain region in the n+-type region 6 and the n+-type region 7 are made to be shallower than the p-type region 80. Thus, the n+-type regions 6 and 7 are surrounded with the p+-type regions 15 and 80.

A side wall 16 such as an oxide film is formed on the side wall of the second gate electrode 3, and metal silicide films of high fusing point such as titanium silicide films 17 and 18 are formed, in a self-aligning manner, on the region serving as one source/drain in the n+-type region 6, the n+-type region 7 serving as the other source/drain, and the gate electrode 3.

Description is now made of the operation of the peripheral portion of the memory cell shown in FIG. 3. The above described soft errors are caused because electrons out of electron-hole pairs generated upon incidence of radioactive rays such as alpha rays into a semiconductor chip are collected in the n+-type regions 6 and 7. More specifically, alpha rays entering the semiconductor chip generate a large number of electron-hole pairs along the range thereof before being stopped by losing energy, and particularly those generated in depletion layers 11 and 12 are immediately separated by the electric fields in the depletion layers 11 and 12 so that electrons are collected in the n+-type regions 6 and 7 and the holes flow down through the p−-type semiconductor substrate 1. The electron-hole pairs generated in the n+-type regions 6 and 7 are recombined and hence, the same exert no influence on increase or decrease of the electrons in the n+-type regions 6 and 7. Furthermore, out of the electron-hole pairs generated in the p−-type semiconductor substrate 1, only electrons reaching the depletion layers 11 and 12 by diffusion are collected in the n+-type regions 6 and 7 to cause soft errors, while the remaining electrons are recombined in the p−-type semiconductor substrate 1.

In the embodiment shown in FIG. 3, the n+-type regions 6 and 7 are surrounded with the p+-type regions 15 and 80 having higher impurity concentration than that in the p−-type semiconductor substrate 1, whereby the depletion layers 11 and 12 formed between the n+-type regions 6 and 7 and the p−-type regions 15 and 80 are reduced in width and the n+-type regions 6 and 7 are increased in capacity. Thus, the difference between electron numbers corresponding to "0" and "1" stored in n+-type regions 6 and 7 is increased to provide allowance with respect to the electrons generated upon incidence of alpha rays or the like. Furthermore, since the n+-type regions 6 and 7 are formed in the p+-type regions 15 and 80, the life time of the electrons diffused from the p−-type semiconductor substrate 1 are reduced within the p+-type regions 15 and 80, so that it becomes difficult to reach the n+-type regions 6 and 7. A potential barrier against the electrons is formed in the interface between the p−-type semiconductor substrate 1 and the p+-type regions 15 and 80 to prevent passage of low-energy electrons of those diffused from the p−-type semiconductor substrate 1, so that occurrence of soft errors can be prevented.

Additionally, since the source/drain region within the n+-type region 6 and the n+-type region 7 are made to be shallower than the p+-type region 80, diffusion resistance in these regions increases and interconnection resistance in the second gate electrode 3 increases as the electrode 3 is made finer. Therefore, as described above, a side wall 16 such as an oxide film is formed on the side wall of the second gate electrode 3, and metal silicide films of high fusing point such as titanium silicide films 17 and 18 are formed, in a self-aligning manner, on the region serving as one source/drain within the n+-type region 6, the n+-type region 7 serving as the other source/drain, and the gate electrode 3, so that these resistance can be reduced, whereby good operation of a memory transistor is maintained.

As shown in the above described embodiment, the n+-type region 7 connected to a bit line 20 is in contact with the p+-type region 80, so that depletion capacity of the junction is increased and stray capacitance $C_B$ of the bit line is increased. The voltage V of signals sensed by a sense amplifier is given by;

$$V = (V_D - V_T)/\{1 + (C_B/C_S)\},$$

wherein $V_D$ is the drain voltage of the transfer gate transistor, $V_T$ is the threshold voltage of the transfer gate transistor and $C_S$ is the memory cell capacity. If the stray capacitance $C_B$ is increased, the signal voltage is decreased and the operation as storage capacity becomes unstable. Therefore, increase in stray capacitance $C_B$ must be prevented.

A bit line 20 is formed on the semiconductor region 7 and connected thereto. An interlayer insulation film 19 is optionally formed between the bit line 20 and the refractory metal silicide film 17 placed on the semiconductor n+-type region 6. The insulation film 19 preferably comprises a silicon oxide film or a phosphorous oxide film. Finally, a protective film 21 is optionally formed on the bit line 20. The protective film 21 is preferably made of a material having a low dielectric constant.

Although in the above described embodiment, the n+-type regions 6 and 7 are surrounded with the p+-type regions 15 and 80, and n+-type region in the sense amplifier and an n+-type region in a peripheral circuit may be surrounded with a p+-type region so that soft errors generated in these portions can be reduced.

Although the above description has been made with reference to a dynamic RAM, the present invention is also applicable to a static RAM. In addition, the n channel may be replaced by a p channel and the MOS device may be replaced by a bipolar device.

Although in the above described embodiment, a metal silicide film of high fusing point comprises a titanium silicide film, the titanium silicide film may be replaced by a tantalum silicide film, a tungsten silicide film or a molybdenum silicide film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a thin semiconductor memory device capable of reducing soft errors caused by radioactive rays, comprising
    providing a substrate of a first semiconductivity type;
    forming a semiconductor layer of the first semiconductivity type on the substrate;
    forming a first semiconductor region of a second semiconductivity type on said semiconductor layer, a first part of said region serving as a first source/drain region and a second part of said region serving as a first charge storage region for storing data;

forming a second semiconductor region of the second semiconductivity type on said semiconductor layer and apart from said first semiconductor region, said second semiconductor region serving as a second source/drain region and being connected to a bit line;

forming a dielectric film on said first charge storage region;

forming a first plate electrode on said dielectric film, said plate electrode being provided with a connection to a constant voltage power supply;

diffusing impurities of the first semiconductivity type into said semiconductor layer, along the extent of and in contact with said first and second semiconductor regions, so that said semiconductor layer has higher impurity concentration than said substrate for preventing soft errors caused by radioactive rays;

forming a gate insulator film on said semiconductor layer at least between said first and second semiconductor regions;

forming a gate electrode on said gate insulator film and connecting said gate electrode to a word line;

forming a first refractory metal silicide film on said first source/drain region;

forming a second refractory metal silicide film on said second semiconductor region; and forming a third refractory metal silicide film on said gate electrode, said first, second and third films being formed in a self-aligning manner with respect to one another and said first and second refractory metal silicide films being formed to reduce the resistance of the source/drain region.

2. The method of claim 1, further comprising
forming an oxide film on a side wall of said second gate electrode.

3. The method of claim 1, wherein
said first, second and third metal silicide films are films of high fusing point which comprise a titanium silicide film, a tantalum silicide film, a tungsten film or a molybdenum silicide film.

4. The method of claim 1, wherein
said semiconductor substrate of the first conductivity type has an impurity concentration of about $10 \times 10^{14}$ to $1 \times 10^{16} cm^{-3}$; and
said semiconductor layer of the first conductivity type has an impurity concentration of about $1 \times 10^{15}$ to $1 \times 1-^{17} cm^{-3}$.

5. The method of claim 1, wherein
the semiconductor device is capable of reducing soft errors caused by radioactive rays comprising alpha rays.

6. The method of claim 1, further comprising
forming on both ends of said semiconductor substrate an insulator film for isolating elements.

7. The method of claim 6, further comprising
forming a region of the first conductivity type for preventing inversion and parasitism in said semiconductor substrate beneath said insulator film for isolating elements, said region having higher impurity concentration than that of the substrate;

8. The method of claim 1, further comprising
forming an interlayer insulation film of low dielectric constant between said first and said second refractory metal silicide films and said bit line.

9. The method of claim 8, wherein
said interlayer insulation film comprises a film selected from the group consisting of a silicon oxide film and a phosphorus glass film.

10. The method of claim 1, further comprising
forming a protective film of low dielectric constant on said bit line.

11. The method of claim 10, wherein
said protective film comprises a film selected from the group consisting of a silicon oxide film and a phosphorous glass film.

* * * * *